United States Patent [19]

Takei et al.

[11] Patent Number: 4,910,568
[45] Date of Patent: Mar. 20, 1990

[54] IMAGE SENSOR

[75] Inventors: Akira Takei, Yokohama; Tetsuo Nishikawa, Kawasaki, both of Japan

[73] Assignee: Fujitsu Limited, Kawasaki, Japan

[21] Appl. No.: 346,268

[22] Filed: May 1, 1989

Related U.S. Application Data

[63] Continuation of Ser. No. 49,920, May 15, 1987, abandoned.

[30] Foreign Application Priority Data

May 26, 1986 [JP] Japan ................... 61-119347

[51] Int. Cl.$^4$ ............... H01L 29/78; H01L 27/14; H01L 27/12
[52] U.S. Cl. .................... 357/24; 357/30; 357/49
[58] Field of Search ........... 357/24, 24 LR, 49, 71, 357/68, 65, 30 D, 30 H, 30 Q

[56] References Cited

U.S. PATENT DOCUMENTS

| | | | |
|---|---|---|---|
| 4,378,565 | 3/1983 | Ghezzo et al. | 357/49 |
| 4,484,210 | 11/1984 | Shiraki et al. | 357/24 LR |
| 4,618,874 | 10/1986 | Yamada | 357/24 LR |
| 4,658,278 | 4/1987 | Elabd et al. | 357/24 LR |
| 4,675,982 | 6/1987 | Noble, Jr. et al. | 357/51 |

FOREIGN PATENT DOCUMENTS

55-88374  7/1980  Japan ..................... 357/24

Primary Examiner—Andrew J. James
Assistant Examiner—Ngan Van Ngo
Attorney, Agent, or Firm—Armstrong, Nikaido, Marmelstein, Kubovcik & Murray

[57] ABSTRACT

Field isolation between arrayed picture cells of an image sensor is fabricated thinner than the insulation layer for the peripheral portion of CCD operatively connected to picture cells. The field isolation is fabricated by a selective thermal oxidization, by which the isolation film inflates not only vertically but also laterally, therefore the thinner isolation layer can be narrower. And, the lower applied voltage to the picture cell than applied voltage to the CCD portion allows the narrower isolation. The narrower field isolation between the picture cells allows greater density of integration of the picture cells. Procedures to embody the invention are disclosed, one of which is to fabricate the thinner isolation first, and another one is the thicker insulation layer first.

3 Claims, 7 Drawing Sheets

IMAGE SENSOR

This application is a continuation of application No. 049,920 filed May 14, 1987.

BACKGROUND OF THE INVENTION

1. Field of the Invention

This invention relates to a semiconductor image sensor having a CCD (charge-coupled device) connected thereto. More particularly, this invention relates to a structure and its fabrication method of the image sensor in order to achieve a great density of its integration.

2. Description of the Related Art

An image sensor of a one-dimensional array structure having a CCD, which outputs the electrical signal produced in each of the light detection cells (referred to hereinafter as picture cells) of the image sensor, of 2K pixels (2048 cells) has been used in practical applications. The total chip length of the array of the picture cells is approximately 30 mm, 27 mm of which is for the picture cells. That means the pitch of the picture cells is 14 μm including 1.5 μm for a field isolation between the picture cells. The operating voltage biasing the picture cells is usually 5 V, the same as that of a MOS transistor, however, the operating voltage of the CCD portion connected to the picture cells is usually 12 V due to the inherent requirement of the CCD.

Figures 1A, 1C:
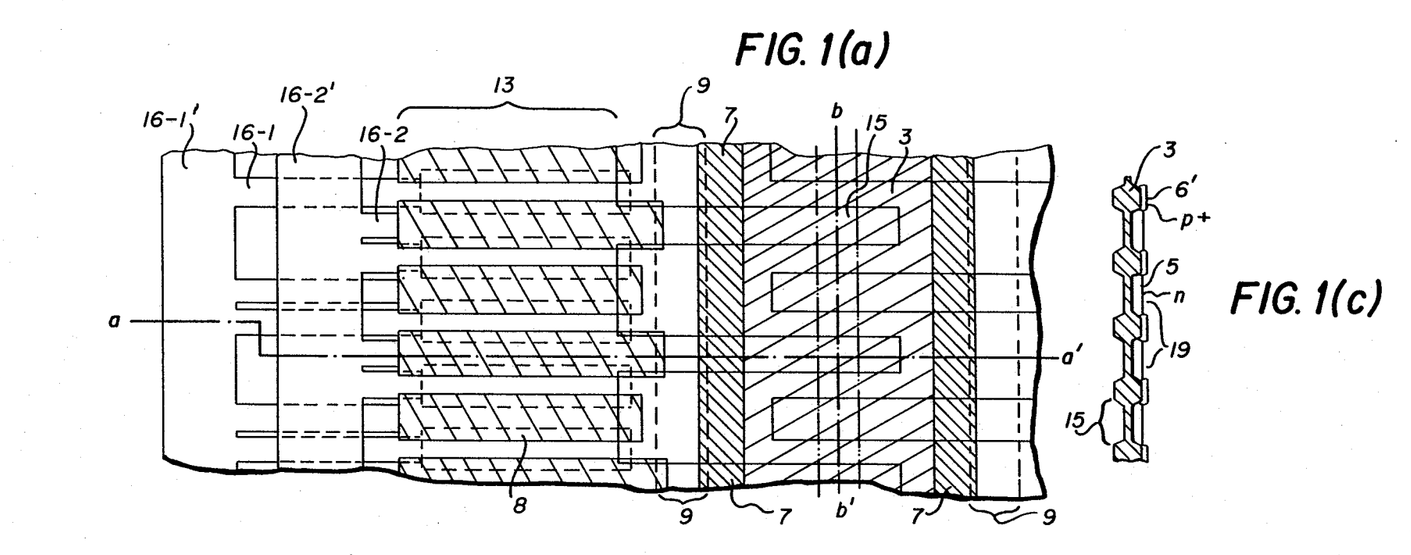
FIG. 1(a) is a schematic plain view of an embodiment of the present invention.
FIG. 1(c) is a schematic cross-sectional side view seen at the line b-b′ of FIG. 1(a).
Figure 1B:
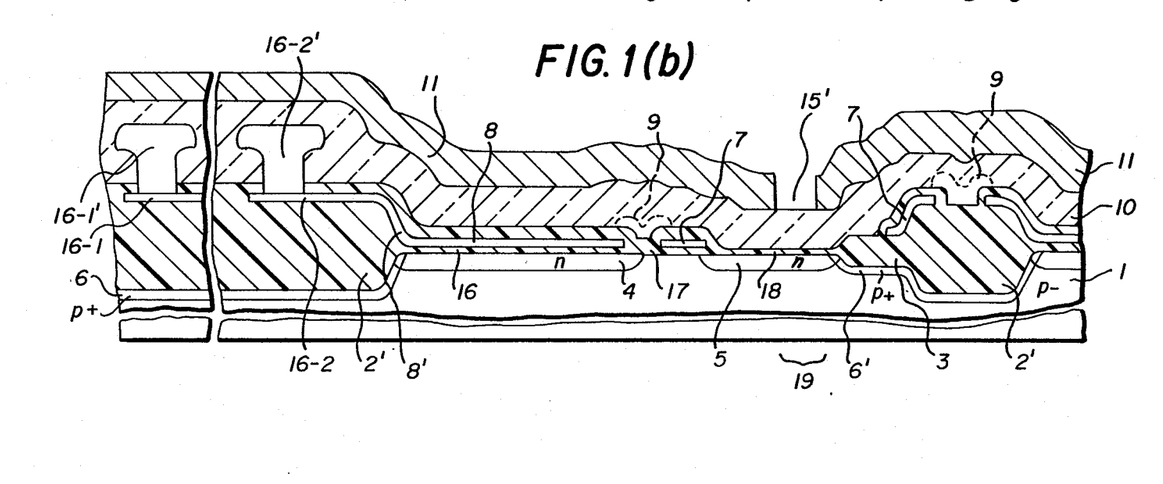
FIG. 1(b) is a schematic cross-sectional side view seen at the line a-a′ of FIG. 1(a).

An explanation of the prior art is given by using FIGS. 1 and its numerals of the present invention. The insulation layer 2 for isolating peripheral wirings in the CCD, such as aluminum buses 16-1′, 16-2′ and polycrystalline silicon wirings 16-1, 16-2 connected to charge-transfer electrodes 8 in the CCD 13, from the semiconductor substrate 1 are fabricatred at the same time with the field isolations 3 which are for isolating the neighboring picture cells 19. It means that the insulation layer 2 for the peripheral portion and the field isolation layer 3 for the picture cells are of the same thickness (though in FIG. 1 the thickness is not shown the same), which is adequate to withstand the applied voltage, 12 V, to the CCD, but excessively thicker than the voltage required for withstanding the applied voltage, 5 V, to the picture cells. The meaning of the above-mentioned "withstand the applied voltage to the CCD" is hereinafter explained. When the field intensity in the p+ region 6 of the substrate underneath the insulation layer 2 exceeds a threshold level effected by the voltage of the wirings 16-1 through 16-2′, the p+ region 6 is inverted causing an unexpected lateral leak path therethrough, thus resulting in a degradation of function of the device.

For fabricating these insulation layer and field isolation, firstly a silicon dioxide (referred to hereinafter as SiO₂) film 16, 17 and 18 of FIG. 1(b), thickness of which is adequate for CCD transferring operation, therefore much thinner than the insulation layers for peripheral wiring or the field isolations of the picture cells, is formed over a semiconductor substrate (or a substrate including some already doped regions). Then the portion excepting that to be exposed for fabricating insulation layer 2 as well as the field isolation 3 is protected by a mask. The exposed portion is additionally oxidized by a thermal oxidation method until the exposed insulation film becomes thick enough to be an insulation layer of the peripheral portion of the CCD. During this additional oxidation, the width of the field isolation also expands laterally wider according to the amount of the thickness inflation (i.e. height) of the insulation layer to be obtained. Therefore, the width of the field isolation for the picture cells are excessively wider than the width required for withstanding the applied voltage.

On the other hand, a request for an image sensor of greater integration, such as 5K pixels, i.e. 5K cells, on a chip of same size, has been recently increasing. To satisfy this requirement, the pitch of the picture cells must be less than 7 μm. Accordingly, the width of the field insulation also must be reduced, in order to avoid reduction of the opening rate of the picture cells. If 2 μm is required for the width of the finished field isolation, its photo mask must have the width of 1 μm. Alignment of the mask of pattern of this size is very difficult. Therefore, a structure and a production method have been sought to overcome the difficulty for producing an image sensor of greater integration such as 5K pixels.

SUMMARY OF THE INVENTION

It is an object of the present invention, therefore to provide a structure and its fabrication method of a image sensor, having a charge-coupled device therewith, of greater density of integration, and having fair opening ratio of the picture cell.

In an image sensor according to the present invention, a field isolation between picture cells of the image sensor is made essentially thinner than an insulation layer which isolates the peripheral portion, such as patterned wirings, of the CCD, from the substrate. Subsequently, the field isolation, which is inflated thicker and wider during thermal oxidation, can be made narrow so as to achieve greater density of integration, while its production is not difficult and the opening ratio, i.e. sensitivity, of the image sensor is kept fair.

Procedures to fabricate the above-mentioned configuration of the image sensor are also proposed.

The above-mentioned features and advantages of the present invention, together with other objects and advantages, which will become apparent, will be more fully described hereinafter.

DESCRIPTION OF THE PREFERRED EMBODIMENTS

Referring to FIGS. 1(a) through (c), a structure of an image sensor according to the present invention is hereinafter explained. The general structure is that an array of picture cells for image sensing are located along the center line b-b′. CCDs 13 for transferring and outputting the signal charges produced in picture cells are symmetrically arranged at both sides of the line b-b′, further more, main peripheral portions, such as 2-phase buses 16-1′ and 16-2′ to charge-transfer electrodes 8 of the CCD 13, are symmetrically arranged outside of the charge transfer electrodes 8.

On a p⁻-type semiconductor substrate 1, an n-type region 5 is doped to form a p-n junction with the substrate. A photo gate 7 is formed in a $SiO_2$ insulation layer 17 by a silicon gate technique to hold the picture cells at a predetermined potential. A light injected through an opening 15' of an aluminum coating 11, through a PSG (phospho silicate glass) passivation film 10 and through a window 15 of an $SiO_2$ layer film 18 into the p-n junction, produces signal charges in the p-n junction depending on the intensity of the injected light. A picture cell 19 of the image sensor is thus constituted there, as well known. Each picture cell 19 is isolated from each other by a field isolation 3 shown by the hatched area in FIGS. 1(a) and (c). As for its thickness, explanation shall be given later in detail. Underneath the field isolation 3, a $p^+$-type region 6' is formed as a channel stop to prevent a lateral conduction path between the adjacent cells through the substrate 1, as well known. The signal charge produced by the injected light in the n-type region 5 of the picture cell is transferred by a transfer gate 9 into under a corresponding one of the charge transfer electrodes 8 of the CCD 13. Underneath each of the charge transfer electrodes 8, an n-type region 4 is formed for storing and transferring the signal charges. Arrays of the charge transfer electrodes 8 of polycrystalline silicon together with the n-type region 4 are thus forming the CCD 13, as well known. In a peripheral portion of the CCD, a pair of the electrodes 8, one shown by solid lines and one shown by dotted lines, is connected together alternatively to a patterned aluminum bus 16-1', and the next pair to 16-2', each formed on an insulation layer 2 of $SiO_2$, as well known. These two groups of patterned buses are supplied with 2-phase clock pulses $\phi_1$ and $\phi_2$ respectively for the charge transfer operation. The CCD portion is illustrated merely schematically in FIGS. 1 omitting the details.

The supplied voltage to the CCD portion is generally as high as 12 V inherently required for charge transfer operation. The insulation layer 2 is approximately 8000Å thick, enough to prevent the field effect of the voltage, 12 V, of the aluminum buses 16-1', 16-2' and polycrystalline silicon lead 16-1, 16-2 onto the region 6 which must be inactive underneath the insulation layer 2. The transfer gate 9 is also supplied with 12 V. Where the transfer gate 9 must exert its influence (i.e. field effect) on the substrate for its charge transfer operation, the transfer gate 9 is located close to the substrate 1. However, at a portion where the transfer gate 9 must not exert its influence on the substrate, the transfer gate 9 is separated from the substrate 1 by the thick insulation layer 2' which is fabricated together with the insulation layer 2 and has the same thickness, as shown in FIG. 1(b).

Thickness of the field isolation 3 is approximately 3000 to 4000Å, which is less than that of the insulation layer 2. The width is approximately 2 μm or less, which can be achieved due to its reduced thickness, because the width laterally inflates wider when the thickness is inflated by the thermal oxidization. The applied voltage on the picture cells as well as the photo gate 7 is generally 5 V. Thus, the field isolation can be narrowed as long as the field isolation 3 can isolate the neighboring picture cells. The narrowed width of the field isolation contributes to provide an adequate area for each picture cell, which means fair sensitivity of light detection, as well as fair opening ratio of the picture cells, as high as approximately 70%. The opening ratio is essential for obtaining more accurate information of the light intensity. Accurate information means information from a wider area of the picture cell.

Two fabrication methods of the image sensor according to the present invention are hereinafter described.

A first method is explained, referring to FIG. 2 through FIG. 8, schematically illustrating only main steps and a main portion related to embody the method of the present invention. The steps are:

(1) On a portion where a field isolation 24 (i.e. 2 of FIG. 1, and cited as the first insulation layer in the claims) of the peripheral portion is to be fabricated on a $p^-$-type semiconductor substrate 1, a $p^+$-type impurity 22' is doped for preparing a channel stop, by a known method, such as ion implantation. An $SiO_2$ layer 23 is formed over the substrate 21, so as to cover all the surface including the doped regions 22' as thick as approximately 1000 Å, by a known method, such as thermal oxidization. The order of these processes can be reversed.

Figure 2:
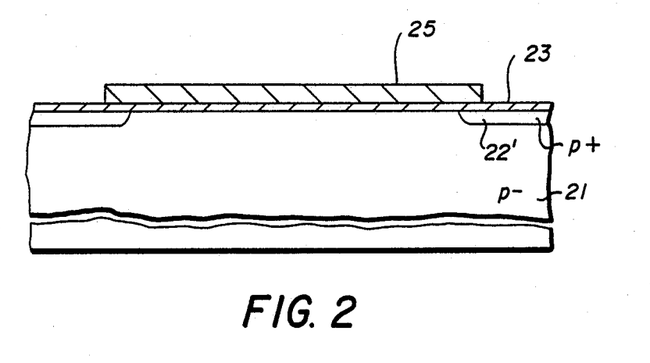
FIG. 2 through FIG. 8 schematically illustrate main steps of a method to fabricate an image sensor according to the present invention.

(2) A silicon nitride (referred to hereinafter as $Si_3N_4$) film 25 is formed over the the $SiO_2$ film 22, so as to cover the area except for the area for fabricating an insulation layer in the peripheral portion of the CCD as shown in FIG. 2 using known methods, such as CVD (chemical vapor deposition) and a photo lithography technique. The $Si_3N_4$ film 25 can be commonly used as a mask of the above-mentioned ion implantation.

Figure 3:
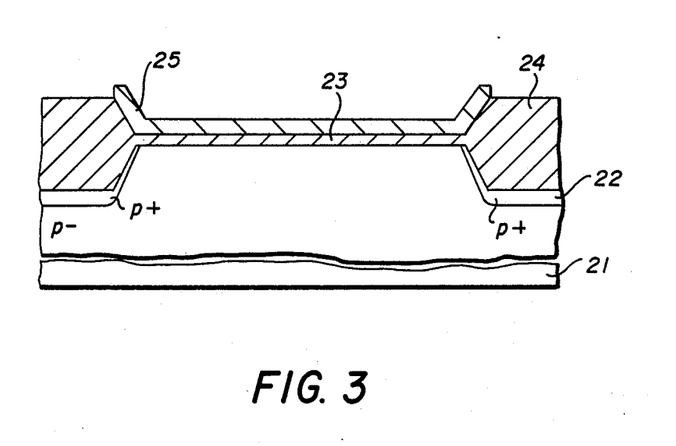

(3) Approximately 7000Å thick $SiO_2$ layers 24 are formed on the exposed portion, i,e. not-masked portion by the $Si_3N_4$ film 25, of the $SiO_2$ layer 23 by a known method, such as selective oxidization method, i.e. so called LOCOS (Local Oxidization of Silicon) as shown in FIG. 3. Silicon inflates both vertically and laterally when it is oxidized, thus the surface becomes taller and the $p^+$ region 22' is moved down deeper into the substrate. Thus, the field isolation 24 and its channel stop 22 are fabricated.

Figure 4:
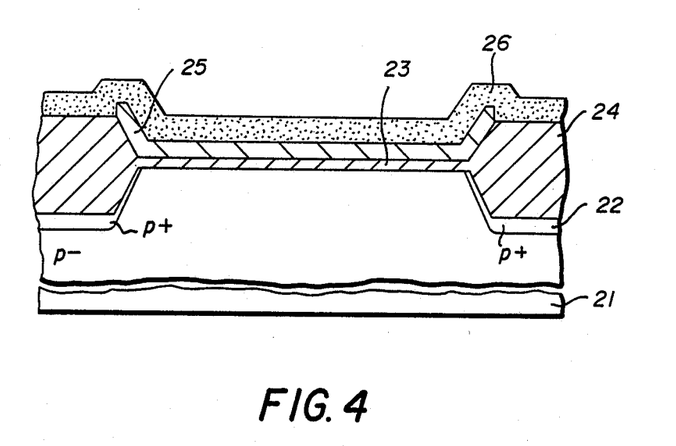

(4) A photo resist film 26 is formed all over the $Si_3N_4$ film 25 as well as over the inflated insulation layer 24, as shown in FIG. 4.

Figure 5:
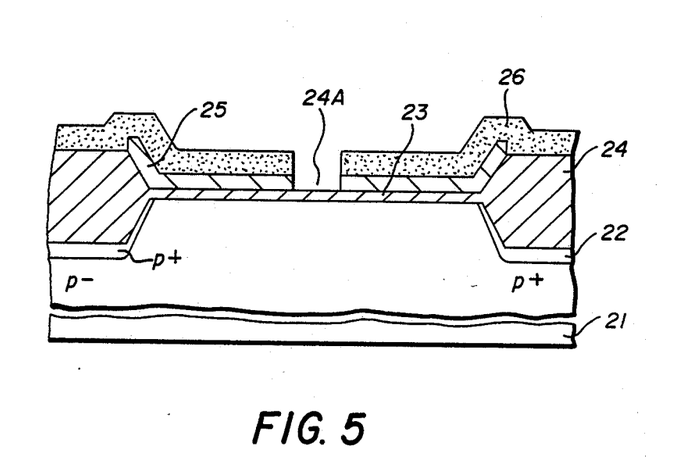

(5) An opening 24A is formed in the photo resist film 26, on a portion where a picture cell is fabricated, by a known method, such as lithography technique. Exposed portion of the $Si_3N_4$ film 25 through the opening of the photo resist film is etched by a known method, such as a wet etching method, so that the opening 24A is made to expose the $SiO_2$ layer 23 therein, as shown in FIG. 5.

Figure 6:
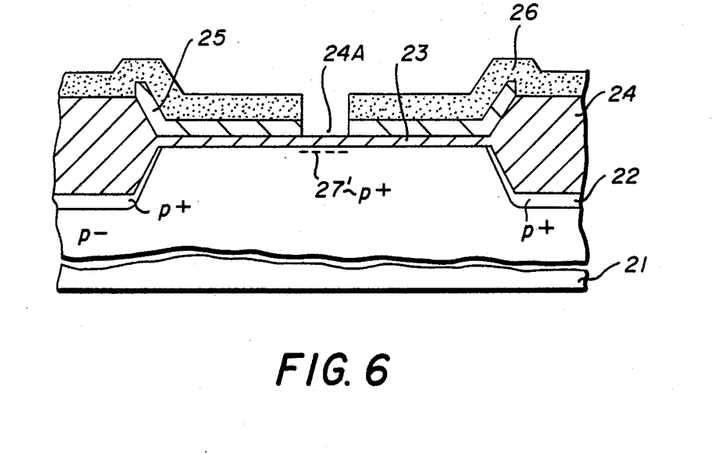

(6) A $p^+$-type dopant 27', such as boron, is doped into the $p^-$-type substrate 21 through the $SiO_2$ layer 23 by a known method, such as ion implantation, for preparing a channel stop, as shown in FIG. 6.

Figure 7:
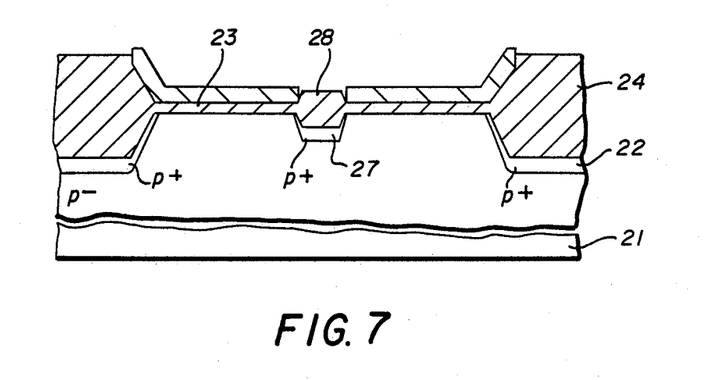

(7) The photo resist film 26 is removed by a known method such as a stripping process. Then, the exposed portion of $SiO_2$ layer 23 through the opening 24A is additionally oxidized by a known method, such as thermal oxidization, so that the $SiO_2$ in the opening 24A is inflated to be as thick as 3000 to 4000Å. Thus the field isolation 28, which is cited as the second insulation layer in the claims, is fabricated between the picture cells as shown in FIG. 7. Then, the $p^+$-type dopant 27' forms a channel stop region 27 underneath the fabricated field isolation 28.

Figure 8:
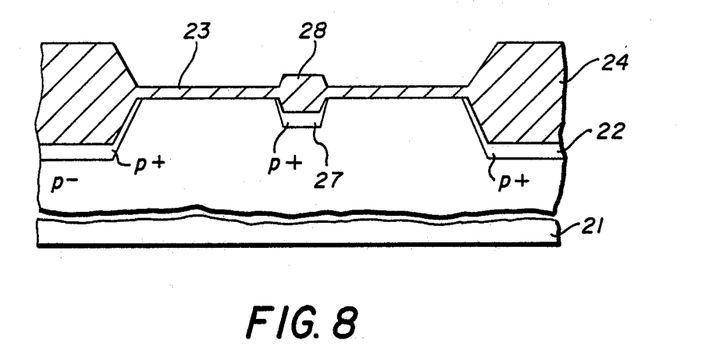

(8) The $Si_3N_4$ film 25 used as an etching mask is removed, as shown in FIG. 8.

A second method is explained, referring to FIG. 9 through FIG. 13, schematically illustrating only the main steps and the main portion related to the embodiment of the method of the present invention. The steps of the method are:

(1) On a portion where an insulation layer 24 (i.e. 2 of FIGS. 1) of the peripheral portion of the CCD as well as a portion where field isolation 28 (i.e. 3 of FIGS. 1) for picture cells is to be fabricated on a $p^-$-type semiconductor substrate 21, $p^+$-type impurity 22' and 27' are selectively doped to prepare channel stops, by a known method, such as ion implantation. An $SiO_2$ layer 23' is formed on the substrate 21, so as to cover all the surface including the doped regions 22' and 27' as thick as approximately 1000 Å, by a known method, such as thermal oxidization. The order of these processes can be reversed.

Figure 9:
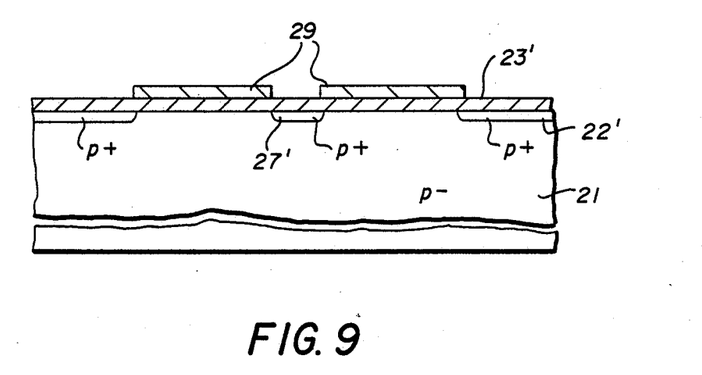
FIG. 9 through FIG. 13 schematically illustrate main steps of a second method to fabricate an image sensor according to the present invention.

(2) A $Si_3N_4$ film 29 is formed over the the $SiO_2$ layer 23', so as to cover the area except for an area for fabricating an insulation layer 24 for the peripheral portion of the CCD as well as an area for a field isolation 28 of the picture cell using a known method, such as CVD and photo lithography technique, as shown in FIG. 9. The $Si_3N_4$ film 29 can be commonly used as a mask for the above-mentioned ion implantation.

Figure 10:
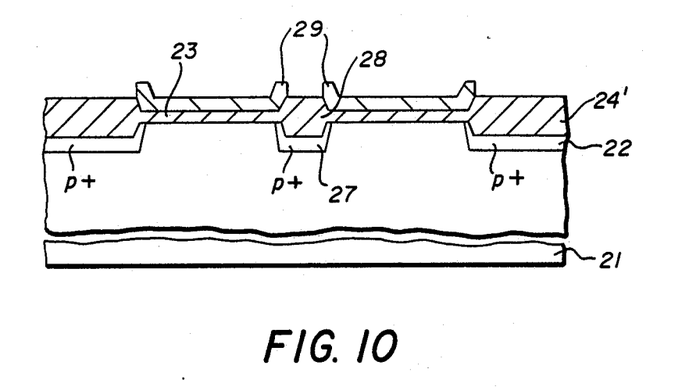

(3) Approximately 3000 to 4000Å thick $SiO_2$ layers 24' and 28 are formed on the exposed portions, i.e. not masked portion by the $Si_3N_4$ film 29, of the $SiO_2$ layer 23 by a known, method, such as selective thermal oxidization method, i.e. so called LOCOS, as shown in FIG. 10, in similar manner to those of FIG. 3. Thus, the field isolation 28 is fabricated.

Figure 11:
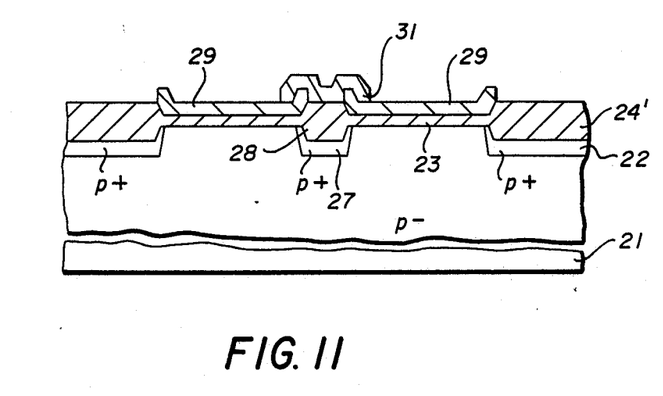
Figure 12:
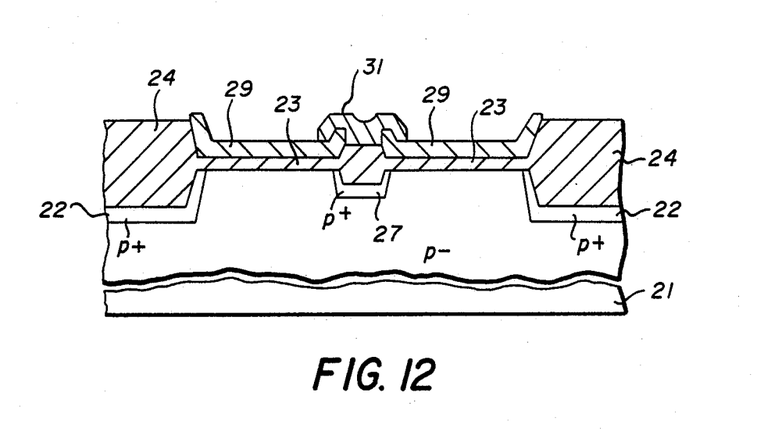

(4) A $Si_3N_4$ film 31 is formed to cover the field isolation 28 by known methods, such as CVD and photo lithography technique, as shown in FIG. 11.

(5) The exposed $SiO_2$ layer 24' is further oxidized, using the $Si_3N_4$ film 29 and 31 as masks, by employing a known method, such as thermal oxidization method, until the exposed $SiO_2$ layer 24' is inflated as thick as approximately 8000Å, thus the insulation layer 24 is fabricated.

Figure 13:
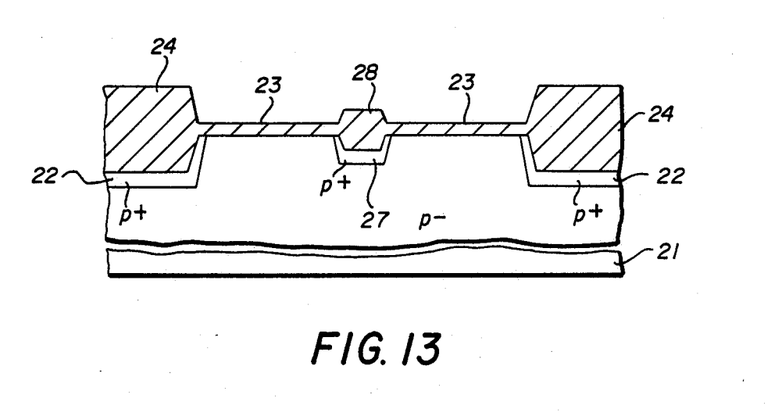

(6) The $Si_3N_4$ film 29 and 31 used as masks are removed by a known method as a stripping process. Thus insulation layers 24 and 28 of different thickness are formed as shown in FIG. 13.

Successive steps, such as forming silicon gates 7, 8, 8', 9, 16-1 and 16-2 and so on, following the step (8) of the first method or the step (6) of the second method are the same as those of the prior art, therefore no more description or drawing are given hereinafter. An insulation layer 2' on which the transfer gate 9 having 12 V is formed is omitted in the explanation referring to FIG. 2 through FIG. 9, because the insulation layer 24 can representatively explain the invention in simplified drawings.

The insulation layer 24 (i.e. 2 of FIGS. 1), fabricated by the above-described methods is thick enough to withstand the applied voltage 12 V, while the field isolation 28, (i.e. 3 of FIGS. 1) is thin and narrow enough to withstand the applied voltage 5 V. Thus, the width of the field isolation 3 can achieve less than a half of that of the prior art, resulting in a fair opening ratio, which is a ratio of the opened width of the picture cell to the cell pitch, achieving more than 70%, compared with about 50% if the prior art is applied thereto. The fair value of the opening ratio means accurate light information received by each picture cell. Consequently, according to the present invention, 5K-pixel image sensor with 2K-pixel size outputting accurate light information is achieved causing no malfunction due to poor isolation of the cells nor difficulty of production.

The many features and advantages of the invention are apparent from the detailed specification and thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. An image sensor formed on a semiconductor substrate, comprising:
    a plurality of semiconductor light detection cells formed on said semiconductor substrate, each of said light detection cells producing electrical signal charges responding to intensity of a light projected thereon;
    a charge - coupled device formed on said semiconductor substrate, operatively connected to said light detection cells for transferring and outputting electrical signal charges produced in said light detection cells;
    a first field insulation layer formed on said semiconductor substrate, for isolating a patterned wiring of a peripheral portion of said charge-coupled device from said semiconductor substrate; and
    a second field insulation layer formed in said semiconductor substrate which selectively extends into a surface of semiconductor substrate, for demarcating an area forming each of said light detecting cells, as well as of isolating and electrically insulating adjacent ones of said light detection cells, a thickness of said second field insulation layer being essentially thinner than a thickness of said first field insulation layer.

2. An image sensor according to claim 1, wherein the thickness of said first field insulation layer is adequate to withstand an applied voltage to said patterned wiring of the peripheral portion, as well as the thickness of said second field insulation layer is adequate to withstand an applied voltage to said light detection cells.

3. An image sensor formed on a semiconductor substrate having a first conductivity type, comprising:
    a plurality of semiconductor light detection cells, each formed on a region having a second conductivity type opposite said first conductivity type in said semiconductor substrate, for producing electrical signal charges responding to intensity of a light projected thereon;
    a charge-coupled device formed on said semiconductor substrate, connected to said light detection cells, for transferring and outputting electrical signal charges produced in said light detection cells;
    a first field insulation layer formed on said semiconductor substrate, for isolating a patterned wiring of a peripheral portion of said charge-coupled device from said semiconductor substrate; and
    a second field insulation layer formed on said semiconductor substrate to selectivley extend into a surface of said semiconductor substrate, for demarcating said region of the second conductivity type forming each of said light detection cells, as well s for isolating and electrically insulating adjacent ones of said light detection cells, a thickness of said second field insulation layer being essentially thinner than a thickness of said first field insulation layer.

* * * * *